(12) United States Patent
Imada

(10) Patent No.: US 9,209,334 B2
(45) Date of Patent: Dec. 8, 2015

(54) SOLAR CELL MODULE

(71) Applicant: SANYO ELECTRIC CO., LTD., Moriguchi-shi, Osaka (JP)

(72) Inventor: Naoto Imada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/458,289

(22) Filed: Aug. 13, 2014

(65) Prior Publication Data

US 2014/0345692 A1 Nov. 27, 2014

Related U.S. Application Data

(63) Continuation of application No. PCT/JP2012/056840, filed on Mar. 16, 2012.

(51) Int. Cl.
*H01L 31/048* (2014.01)
*H01L 31/054* (2014.01)

(52) U.S. Cl.
CPC .......... *H01L 31/0481* (2013.01); *H01L 31/048* (2013.01); *H01L 31/0547* (2014.12); *Y02E 10/50* (2013.01)

(58) Field of Classification Search
CPC .............. H01L 31/048; H01L 31/0481; H01L 31/0224; H01L 31/05; H01L 31/0508
USPC ................................... 136/251, 252, 256, 259
See application file for complete search history.

(56) References Cited

U.S. PATENT DOCUMENTS 4,235,643 A   11/1980  Amick
6,008,449 A   12/1999  Cole
2006/0272698 A1   12/2006  Durvasula
2010/0252107 A1*  10/2010  Suga ................... H01L 31/0236
                                                                        136/259
2013/0206214 A1   8/2013  Akaike et al.

FOREIGN PATENT DOCUMENTS

| EP | 1732141 A1 | 12/2006 |
| EP | 2613362 A1 | 7/2013 |
| JP | S57-012567 A | 1/1982 |
| JP | H01-099264 A | 4/1989 |
| JP | 2005-050928 A | 2/2005 |
| JP | 2006-344964 A | 12/2006 |
| JP | 2012-004146 A | 1/2012 |
| WO | 99/09601 A1 | 2/1999 |
| WO | 2011/093383 A1 | 8/2011 |
| WO | 2012/029466 A1 | 3/2012 |

* cited by examiner

OTHER PUBLICATIONS

JP01-099264A—Deguchi, English translation, Apr. 18, 1989, pp. 1-8.*

*Primary Examiner* — Susan D Leong
(74) *Attorney, Agent, or Firm* — Marvin A. Motsenbocker; Mots Law, PLLC

(57) ABSTRACT

A solar cell module includes an encapsulant and a solar cell in the encapsulant. The encapsulant includes a light-receiving side encapsulant at a light-receiving surface side of the solar cell, and a colored rear side encapsulant at a rear surface side of the solar cell. The rear side encapsulant contains an ethylene-vinyl acetate copolymer. An interface between the rear side encapsulant and the light-receiving side encapsulant is in contact with a side surface of the solar cell. In a part of an area where no solar cell is provided, the rear side encapsulant bulges to the light-receiving surface side.

14 Claims, 3 Drawing Sheets

SOLAR CELL MODULE

CROSS REFERENCE TO RELATED APPLICATIONS

This application is a continuation application of International Application No. PCT/JP2012/056840, filed on Mar. 16, 2012, entitled "SOLAR CELL MODULE", the entire contents of which are incorporated herein by reference.

BACKGROUND

The invention relates to a solar cell module.

Patent Document 1 discloses a solar cell module in which solar cells are disposed between a transparent light-receiving side encapsulant containing an ethylene-vinyl acetate copolymer (EVA) and a white-colored rear side encapsulant containing an ethylene-vinyl acetate copolymer.

Patent Document 1: Japanese Patent Application Publication No. 2005-50928

SUMMARY OF THE INVENTION

There is a demand for further improvement of the reliability and the output characteristics of a solar cell module.

One aspect of the invention provides a solar cell module with improved reliability and improved output characteristics.

A solar cell module according to an embodiment is provided with an encapsulant and a solar cell. The solar cell is disposed in the encapsulant. The encapsulant includes a light-receiving side encapsulant, and a colored rear side encapsulant. The light-receiving side encapsulant is positioned at a light-receiving surface side of the solar cell. The rear side encapsulant is positioned at a rear surface side of the solar cell. The rear side encapsulant contains an ethylene-vinyl acetate copolymer. An interface between the rear side encapsulant and the light-receiving side encapsulant is in contact with a side surface of the solar cell. In a part of an area where no solar cell is provided, the rear side encapsulant bulges to the light-receiving surface side.

The embodiments above provide a solar cell module with improved reliability and improved output characteristics.

EMBODIMENTS

Figure 1:
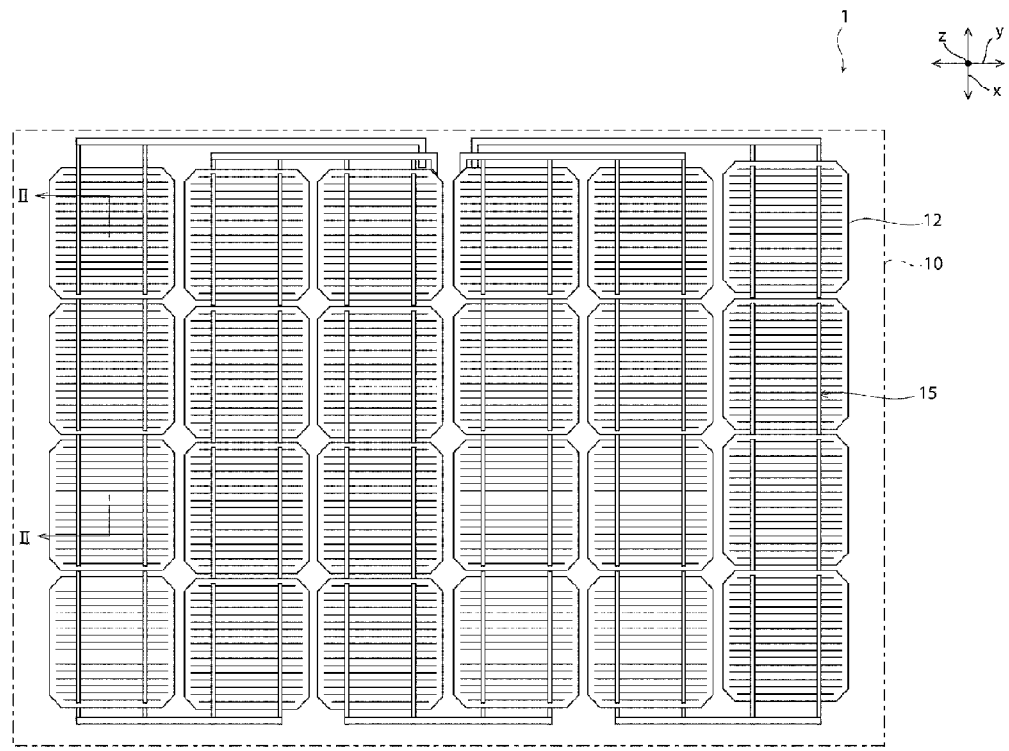
FIG. 1 is a schematic plan view of a solar cell module according to an embodiment.

Hereinafter, examples of preferred embodiments are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

Figure 2:
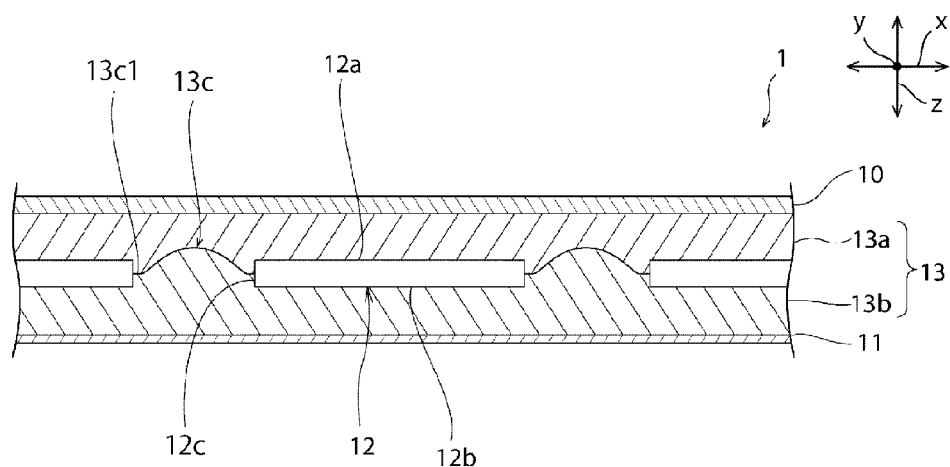
FIG. 2 is a schematic cross-sectional view taken along a line II-II part in FIG. 1.

As illustrated in FIG. 1 and FIG. 2, solar cell module 1 includes a plurality of solar cells 12 electrically connected to one another with wiring materials 15. A plurality of solar cells 12 are disposed at intervals in a matrix. Instead, a solar cell module may be provided with only one solar cell as a matter of course.

The type of solar cell 12 is not particularly limited. Solar cell 12 can be formed of, for example, a crystal silicon solar cell, a thin-film solar cell, or the like. Solar cell 12 may generate power only when light is received on light-receiving surface 12a. Solar cell 12 may be a bifacial solar cell that generates power not only when light is received on light-receiving surface 12a, but also when light is received on rear surface 12b. Herein, the "light-receiving surface" indicates a major surface on which light is mainly received.

A plurality of solar cells 12 are disposed in encapsulant 13. Encapsulant 13 seals a plurality of solar cells 12. Encapsulant 13 includes light-receiving side encapsulant 13a and rear side encapsulant 13b.

Rear side encapsulant 13b is positioned on a rear surface 12b side of solar cells 12. Rear side encapsulant 13b contains an ethylene-vinyl acetate copolymer that is a cross-linking resin. Rear side encapsulant 13b may be made of an ethylene-vinyl acetate copolymer, or may be made of a resin composition containing an ethylene-vinyl acetate copolymer. Light-receiving side encapsulant 13a is positioned on a light-receiving surface 12a side of solar cells 12. Light-receiving side encapsulant 13a does not contain an ethylene-vinyl acetate copolymer. Light-receiving side encapsulant 13a can be made of, for example, polyolefin that is a non-crosslinking resin, or a resin composition containing polyolefin.

Rear side encapsulant 13b is colored. Rear side encapsulant 13b contains pigment such as titanium oxide, for example. For this reason, part of light entering rear side encapsulant 13b from the light-receiving surface 12a side is reflected to the light-receiving surface 12a side.

Light-receiving surface member 10 is disposed on light-receiving side encapsulant 13a. Rear surface member 11 is disposed on rear side encapsulant 13b. Accordingly, encapsulant 13 is filled in between light-receiving surface member 10 and rear surface member 11.

Light-receiving surface member 10 can be made of, for example, a glass plate or a ceramic plate. Rear surface member 11 can include a resin sheet, or preferably a resin sheet containing no barrier layer such as a metal layer or an inorganic oxide layer. The water vapor transmission rate of light-receiving surface member 10 is preferably lower than that of rear surface member 11, and is more preferably 0.1 or less times lower than that of rear surface member 11.

At least one of side surfaces 12c of at least one of a plurality of solar cells 12 is in contact with interface 13c between rear side encapsulant 13b and light-receiving side encapsulant 13a. All side surfaces 12c of a plurality of solar cells 12 may be in contact with interface 13c. Alternatively, for example, only side surfaces 12c of solar cells 12 opposed to side surfaces 12c of other solar cells 12 may be in contact with interface 13c. In short, not all side surfaces 12c necessarily have to be in contact with interface 13c.

In part of areas where no solar cell 12 is provided, rear side encapsulant 13b bulges to the light-receiving surface 12a side. In the part of the areas where no solar cell 12 is provided, rear side encapsulant 13b preferably protrudes on the light-receiving surface 12a side beyond light-receiving surfaces 12a. In all the areas where no solar cell 12 is provided, rear side encapsulant 13b may bulge to the light-receiving surface 12a side. Alternatively, for example, in at least only one of areas between adjacent solar cells 12, rear side encapsulant 13b may bulge to the light-receiving surface 12a side. In other words, rear side encapsulant 13b is not necessarily to bulge to the light-receiving surface 12a side in all the areas where no solar cell 12 is provided.

As described above, interface 13c is in contact with side surface 12c. Accordingly, rear side encapsulant 13b is in contact with rear surfaces 12b and part of side surfaces 12c of solar cells 12. Rear side encapsulant 13b contains an ethylene-vinyl acetate copolymer that is a cross-linking resin. Thus, rear side encapsulant 13b has low fluidity under high temperature. Therefore, even when the temperature in solar cell module 1 is raised, solar cells 12 are less likely to be displaced. Thus, a solar cell module with improved reliability can be obtained.

When the water vapor transmission rate of rear surface member 11 is higher than that of light-receiving surface member 10, acetic acid generated in rear side encapsulant 13b containing an ethylene-vinyl acetate copolymer tends to be discharged to the outside of solar cell module 1 through rear surface member 11. This can prevent deterioration of solar cells 12 and the like due to the acetic acid. Therefore, the further improved reliability can be obtained.

When light-receiving surface member 10 is made of a glass plate or a ceramic plate and has a low water vapor transmission rate, the acetic acid in encapsulant 13 is hardly discharged to the outside of solar cell module 1 through light-receiving surface member 10. Here, in solar cell module 1, light-receiving side encapsulant 13a does not contain an ethylene-vinyl acetate copolymer that generates acetic acid. Therefore, no acetic acid is generated in light-receiving side encapsulant 13a disposed between solar cells 12 and light-receiving surface member 10. Moreover, interface 13c is in contact with side surface 12c. Accordingly, rear side encapsulant 13b does not exist on light-receiving surface 12a. This makes acetic acid unlikely to be generated in a part that is on the light-receiving surface 12a side viewed from solar cells 12 and hardly allows acetic acid to be discharged therethrough. As a result, deterioration of solar cells 12 and the like due to the acetic acid is effectively suppressed. Therefore, the further improved reliability can be obtained.

From the viewpoint of hindering acetic acid from being generated in a part that is on the light-receiving surface 12a side viewed from solar cells 12 and hardly allows acetic acid to be discharged therethrough, an interface between a light-receiving side encapsulant and a rear side encapsulant may be considered better not to bulge to the light-receiving surface side. However, in this case, the distance between the light-receiving surface member and the rear side encapsulant becomes longer, which results in a long length of a light path through which light entering from the light-receiving surface side, is reflected by the rear side encapsulant, then is reflected by the light-receiving surface member and finally reaches the solar cells. Therefore, the light incident efficiency on the solar cells becomes lower.

In contrast, in solar cell module 1, interface 13c bulges to the light-receiving surface 12a side. Thus, the distance between rear side encapsulant 13b and light-receiving surface member 10 is short, which results in a short length of a light path through which light entering from the light-receiving surface 12a side is reflected by rear side encapsulant 13b and light-receiving surface member 10 and finally reaches solar cells 12. This can enhance the light incident efficiency on solar cells 12. As a result, the improved reliability can be obtained. In other words, solar cell module 1 achieves the improved output characteristics, in addition to the improved reliability.

When rear side encapsulant 13b protrudes on the light-receiving surface 12a side beyond light-receiving surfaces 12a, the length of the light path through which light entered from the light-receiving surface 12a side reaches solar cells 12 after being reflected by rear side encapsulant 13b and light-receiving surface member 10 becomes even shorter. Therefore, the further improved output characteristics can be obtained.

Figure 3:
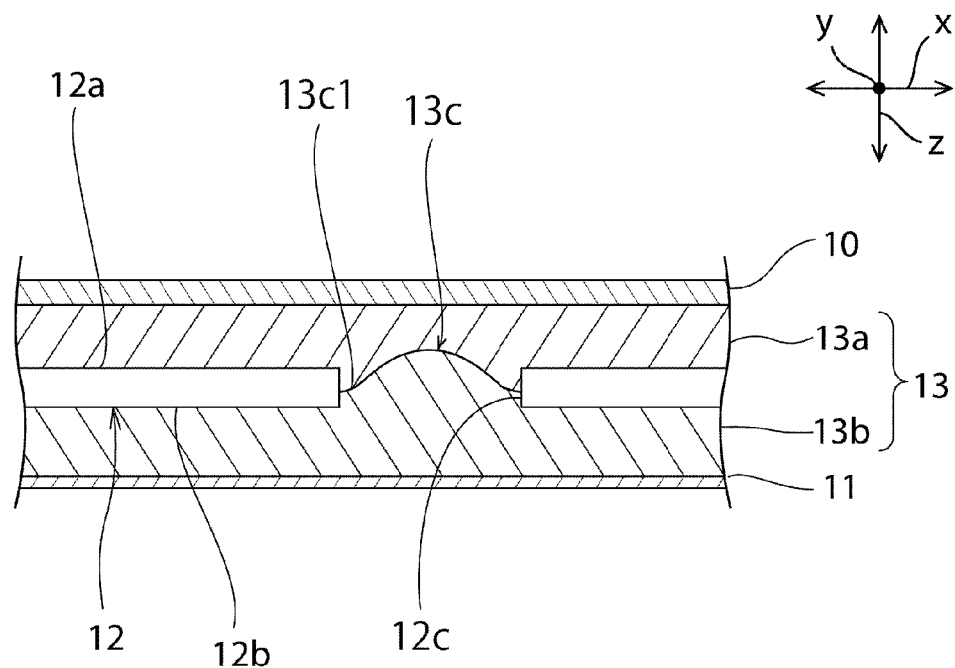
FIG. 3 is a schematic cross-sectional view of a solar cell module according to a first modification example.
Figure 4:
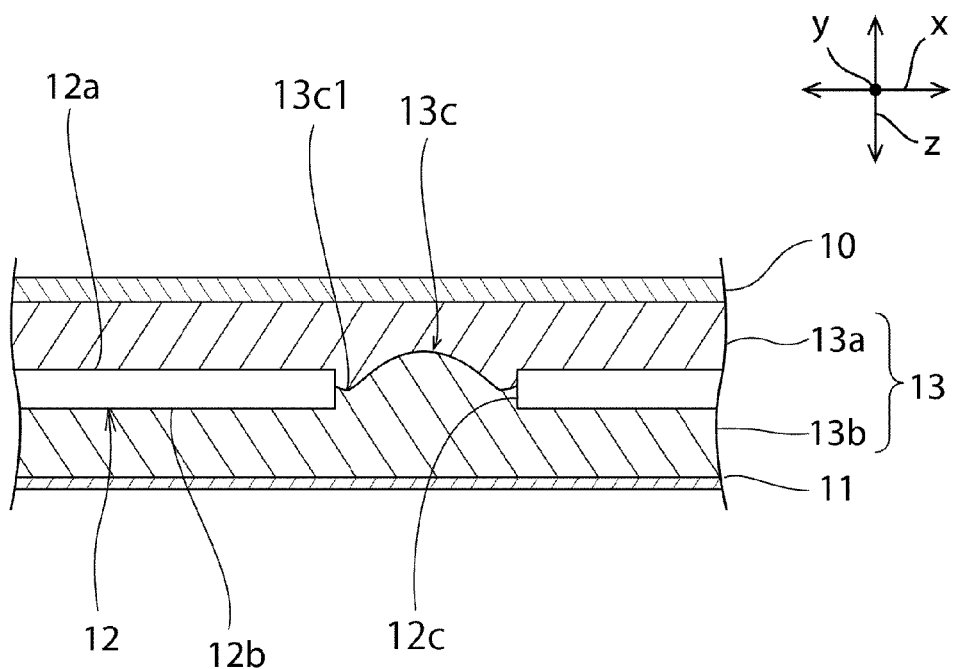
FIG. 4 is a schematic cross-sectional view of a solar cell module according to a second modification example.
Figure 5:
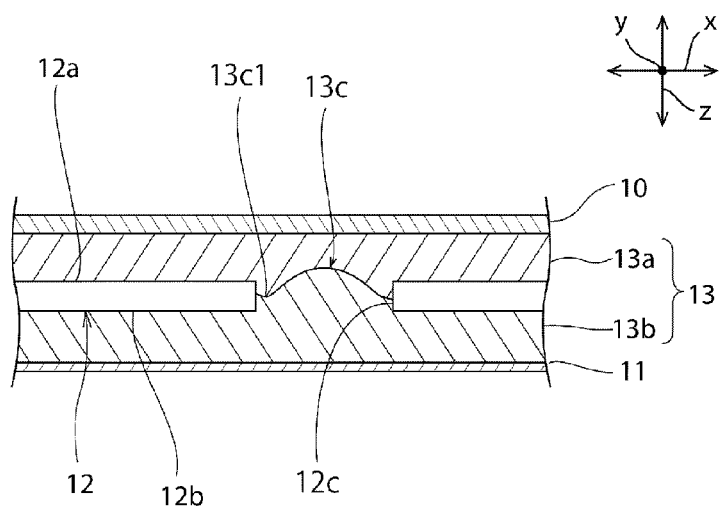
FIG. 5 is a schematic cross-sectional view of a solar cell module according to a third modification example.

As illustrated in FIG. 2, in solar cell module 1, contact portions 13c1 of interface 13c in contact with side surfaces 12c extend substantially perpendicular to side surfaces 12c. However, the invention is not limited to this configuration. For example, as illustrated in FIG. 3, the size of angles formed between contact portions 13c1 and side surfaces 12c may be an acute angle. As illustrated in FIG. 4, the size of angles formed between contact portions 13c1 and side surfaces 12c may be an obtuse angle. As illustrated in FIG. 5, contact portions 13c1 being different in the size of an angle formed with side surface 12c may be present. For example, the size of an angle formed between contact portion 13c1 at one side of interface 13c and side surface 12c may be different from the size of an angle formed between contact portion 13c1 at the other side thereof and side surface 12c. For example, the size of an angle formed between contact portion 13c1 at one side of interface 13c and side surface 12c may be an obtuse angle, whereas the size of an angle formed between contact portion 13c1 at the other side thereof and side surface 12c may be an acute angel.

Solar cell module 1 can be manufactured, for example, by performing lamination of a stacked body in which light-receiving surface member 10, a resin sheet for forming light-receiving side encapsulant 13a, solar cells 12, a resin sheet for forming rear side encapsulant 13b, and rear surface member 11 are stacked in this order. The bulging of rear side encapsulant 13b can be controlled by changing the pressure and the temperature at the lamination. Specifically, a lower pressure at the lamination makes rear side encapsulant 13b bulge more. A higher pressure at the lamination makes rear side encapsulant 13b bulge less. A lower temperature at the lamination makes rear side encapsulant 13b bulge more. A higher temperature at the lamination makes rear side encapsulant 13b bulge less. In this manner, it is possible to control the position and the shape of interface 13c by controlling the bulging of rear side encapsulant 13b.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:
1. A solar cell module comprising:
an encapsulant; and
a solar cell disposed in the encapsulant, wherein,
the encapsulant includes:
a light-receiving side encapsulant positioned at a light-receiving surface side of the solar cell; and a colored rear side encapsulant positioned at a rear surface side of the solar cell, the rear side encapsulant contains an ethylene-vinyl acetate copolymer, an interface between the rear side encapsulant and the light-receiving side encapsulant is in contact with a side surface of the solar cell, and in a part of an area where no solar cell is provided, the rear side encapsulant bulges to the light-receiving surface side.

2. The solar cell module according to claim 1, wherein, in the part of the area where no solar cell is provided, the rear side encapsulant protrudes on the light-receiving surface side beyond the light-receiving surface.

3. The solar cell module according to claim 1, wherein the light-receiving side encapsulant does not contain an ethylene-vinyl acetate copolymer.

4. The solar cell module according to claim 2, wherein the light-receiving side encapsulant does not contain an ethylene-vinyl acetate copolymer.

5. The solar cell module according to claim 1, wherein the light-receiving side encapsulant contains polyolefin.

6. The solar cell module according to claim 2, wherein the light-receiving side encapsulant contains polyolefin.

7. The solar cell module according to claim 3, wherein the light-receiving side encapsulant contains polyolefin.

8. The solar cell module according to claim 4, wherein the light-receiving side encapsulant contains polyolefin.

9. The solar cell module according to claim 1, further comprising:
   a light-receiving surface member disposed on the light-receiving side encapsulant; and
   a rear surface member disposed on the rear side encapsulant, wherein,
   the water vapor transmission rate of the rear surface member is higher than the water vapor transmission rate of the light-receiving surface member.

10. The solar cell module according to claim 2, further comprising:
    a light-receiving surface member disposed on the light-receiving side encapsulant; and
    a rear surface member disposed on the rear side encapsulant, wherein,
    the water vapor transmission rate of the rear surface member is higher than the water vapor transmission rate of the light-receiving surface member.

11. The solar cell module according to claim 3, further comprising:
    a light-receiving surface member disposed on the light-receiving side encapsulant; and
    a rear surface member disposed on the rear side encapsulant, wherein,
    the water vapor transmission rate of the rear surface member is higher than the water vapor transmission rate of the light-receiving surface member.

12. The solar cell module according to claims 5, further comprising:
    a light-receiving surface member disposed on the light-receiving side encapsulant; and
    a rear surface member disposed on the rear side encapsulant, wherein,
    the water vapor transmission rate of the rear surface member is higher than the water vapor transmission rate of the light-receiving surface member.

13. The solar cell module according to claim 9, wherein, the light-receiving surface member is made of a glass plate or a ceramic plate.

14. The solar cell module according to claim 10, wherein, the rear surface member includes a resin sheet.

\* \* \* \* \*